(12) United States Patent
Yoo

(10) Patent No.: US 6,271,459 B1
(45) Date of Patent: Aug. 7, 2001

(54) HEAT MANAGEMENT IN WAFER PROCESSING EQUIPMENT USING THERMOELECTRIC DEVICE

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 09/558,522

(22) Filed: Apr. 26, 2000

(51) Int. Cl.$^7$ .................................................. H01L 35/00
(52) U.S. Cl. .................... 136/201; 136/203; 136/205; 136/242; 62/3.3
(58) Field of Search ...................... 136/201, 203, 136/205, 242, 236.1, 238, 239, 240; 62/3.3

(56) References Cited

U.S. PATENT DOCUMENTS

| | | | |
|---|---|---|---|
| 3,817,043 | * 6/1974 | Zoleta | 62/3 |
| 4,711,971 | * 12/1987 | Duncan et al. | 136/211 |
| 5,740,016 | * 4/1998 | Dhindsa | 361/704 |
| 5,817,188 | 10/1998 | Yahatz et al. | 136/237 |
| 5,996,353 | 12/1999 | Maxwell et al. | 62/3.2 |
| 6,002,081 | 12/1999 | Sakuragi | 136/203 |
| 6,019,098 | 2/2000 | Bass et al. | 126/344 |
| 6,023,481 | 2/2000 | Kuribayashi et al. | 372/34 |

\* cited by examiner

*Primary Examiner*—Kathryn Gorgos
*Assistant Examiner*—Thomas H Parsons
(74) *Attorney, Agent, or Firm*—Skjerven Morrill MacPherson LLP; Theodore P. Lopez

(57) ABSTRACT

A semiconductor processing system and method, which uses heat energy typically wasted in most common semiconductor processing systems, to generate power. The present invention includes a heat management system, which uses the waste heat and/or the excess heat generated by a thermal-processing chamber, to generate a current from a first thermoelectric device. The current from the first thermoelectric device is then delivered to a second thermoelectric device. The second thermoelectric device, driven by the current from the first thermoelectric device, can be used to remove heat from a cooling chamber or else add heat to another processing chamber.

19 Claims, 3 Drawing Sheets

HEAT MANAGEMENT IN WAFER PROCESSING EQUIPMENT USING THERMOELECTRIC DEVICE

BACKGROUND OF THE INVENTION

1. Field of the Invention

The present invention generally relates to semiconductor manufacturing equipment and more particularly to the application of a thermoelectric device to a semiconductor processing system.

2. Description of the Related Art

Semiconductor manufacturing equipment is used to process semiconductor wafers into electronic devices. Typically, to conduct a thermal process, the wafers are loaded into the processing system using a wafer carrier. Generally, a transfer mechanism individually removes the wafers from the carrier and transfers the individual wafers through valves, and into various processing chambers. The transfer mechanism may also move individual wafers between processing chambers to effect different processing steps. During many processing steps the wafers are heated. Thus, one final processing step may include a wafer-cooling step. To effect the wafer-cooling step, the wafers are placed into a cooling chamber until the temperature of the wafers is low enough so that the wafer can be replaced into the carrier.

In most processing systems the process steps and thus, the processing chambers have different requirements for heating and/or cooling of various components or structures, including the wafers. Because of the variable requirements, process chambers are continuously heated up and/or cooled down during a processing cycle, which can result in a substantial amount of energy being wasted.

SUMMARY OF THE INVENTION

The present invention applies the well-known principles of operation of thermoelectric devices to a semiconductor processing system to provide a convenient power supply, to reduce the need for cooling water, and to lower energy consumption. The present invention provides a semiconductor processing system and method, which uses heat energy typically lost or wasted in most common semiconductor processing systems.

As described in greater detail below, the present invention includes a heat management system, which uses heat, waste heat, and/or excess heat generated by a thermal processing chamber or other heat source, to produce power from a first thermoelectric device (power generator). The power is produced by maintaining a temperature difference across a hot side and the cool side of an assembly of semiconductor thermoelectric elements.

In accordance with the present invention, power from the first thermoelectric device can be delivered to a second thermoelectric device (cooler). The second thermoelectric device, driven by the power from the first thermoelectric device, can be used to remove heat from a cooling chamber. At the cold side, energy is absorbed by electrons as they pass from a low energy level element to a higher energy level element. The power supplied by the first thermoelectric device supplies the energy to move the electrons through the system. At the hot side, energy is expelled to a heat sink as electrons move from a high energy level element to a low energy level element.

In one aspect, a semiconductor wafer processing system is provided. The system includes a first processing chamber and a second processing chamber. The first processing chamber includes a first thermoelectric module operative for generating a current. The second processing chamber includes a second thermoelectric module, which receives the current and is operative for reducing the temperature of the second processing chamber.

In yet another aspect of the present invention, a semiconductor wafer processing system is provided which includes a first chamber providing a first source of thermal energy and a second chamber having a first temperature. Also included in the system is a first thermoelectric module being operative for generating a first current in response to receiving the thermal energy, and a second thermoelectric module being configured to receive the first current and being operative for changing the first temperature to a second temperature.

In yet another aspect of the present invention, a method is provided for processing a semiconductor wafer, which includes generating a current with a first thermoelectric module using a heat source; and removing heat from a processing chamber using a second thermoelectric module which is made operative by the current generated by the first thermoelectric module.

By using heat already created by the thermal-processing chamber to produce power, the energy required to cool the cooling chamber can be substantially reduced. Moreover, no plumbing is required in the system of the present invention, since the system of the present invention does not require moving fluids or gases. Other advantages afforded through the use of thermoelectric devices in the heat management system of the present invention are the absence of moving parts, silent operation, and lack of pressure vessels. Since the present invention uses fewer components then conventional heat management systems, the system of the present invention may be made more reliable and more compact, reducing the cost per unit and requiring less floor space.

Other uses, advantages, and variations of the present invention will be apparent to one of ordinary skill in the art upon reading this disclosure and accompanying drawings.

DETAILED DESCRIPTION

The concept of thermoelectric generation is well known. Thermoelectric generation usually involves using typical thermoelectric couples 5, like the example illustrated in FIG. 1. The performance of thermoelectric couples 5 is based on well known thermoelectric generation principles, commonly known as the Seebeck effect and the Peltier effect. The Seebeck effect involves producing a current in a closed circuit of two dissimilar materials 11, forming two junctions, where one junction is held at a higher temperature (hot junction) 7 than the other junction (cold junction) 9. The Peltier effect is the inverse of the Seebeck effect. The Peltier effect involves the heating or cooling of the thermojunctions by passing a current through the junctions. Generally, thermoelectric couples are combined in a module (FIG. 3), where the couples are coupled electrically in series and thermally in parallel. In combining the couples into modules, a greater variety of sizes, shapes, operating currents, operating voltages, and ranges of heat pumping capacity becomes available.

Figure 2:
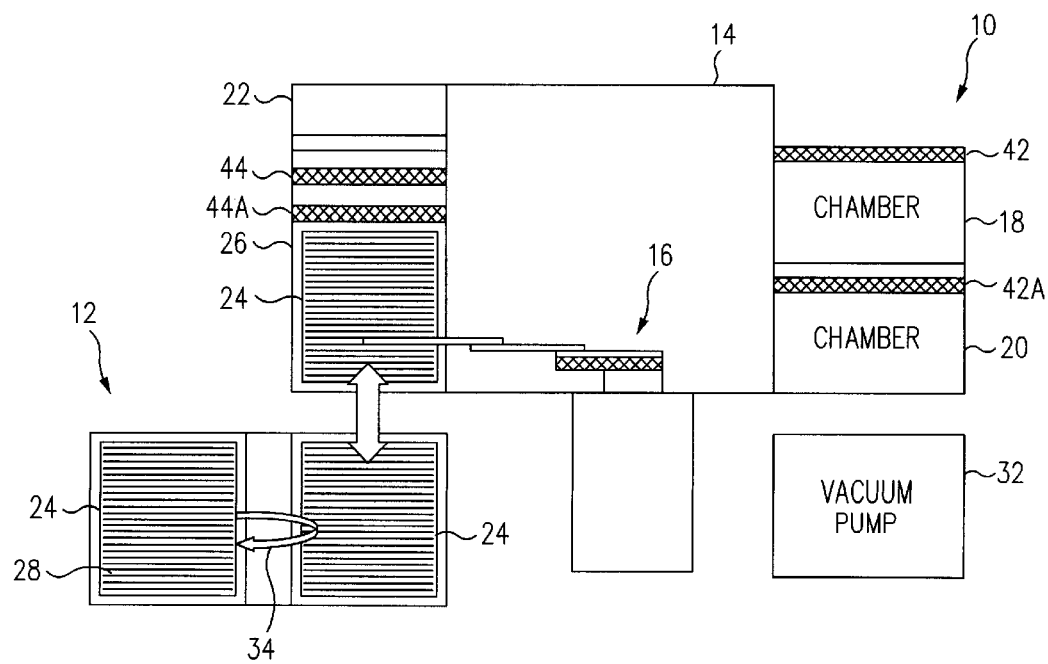
FIG. 2 is a simplified illustration a semiconductor wafer processing system including the heat management system of the present invention.

FIG. 2 is a simplified illustration of a semiconductor wafer processing system 10, which can accommodate the heat management system of the present invention. In this embodiment, wafer processing system 10 includes a loading station 12, a loadlock 26, a transfer chamber 14, a transfer mechanism 16, at least one or more processing chambers 18 and 20, and a cooling chamber 22. Loading station 12 has platforms for supporting and moving wafer carriers, such as wafer carrier 24, into loadlock 26. Carrier 24 is a removable wafer carrier, which can carry up to 25 wafers 28 at a time. Other types of wafer carriers, including fixed wafer carriers, can also be used. Wafer carriers are loaded onto platforms either manually or by using automated guided vehicles ("AGV").

In one embodiment, processing chambers 18 and 20 may be rapid thermal processing ("RTP") reactors. However, the invention is not limited for use with a specific type of reactor and may use any semiconductor processing reactor, such as those used in physical vapor deposition, etching, chemical vapor deposition, and ashing. Reactors 18 and 20 may also be of the type disclosed in commonly assigned U.S. patent application Ser. No. 09/451,494, entitled "Resistively Heated Single Wafer Furnace," which is incorporated herein by reference for all purposes.

In one exemplary embodiment, during processing each wafer 28 from wafer carrier 24 is transported from loadlock 26, through transfer chamber 14, and into process chamber 18 or 20. Movement of each wafer 28 is accomplished using wafer transport mechanism 16, which is capable of lifting wafer 28 from wafer carrier 24 and, through a combination of linear and rotational translations, transporting wafer 28 through vacuum chamber valves (also known as gates) and depositing the wafer at the appropriate position within wafer processing chamber 18 or 20. Similarly, wafer transport mechanism 16 is capable of transporting wafer 28 from one processing chamber 18 or 20 to another and from a processing chamber back to cooling chamber 22.

A pump 32 is provided for use in processes requiring vacuum. In the case where the combined volume of processing chambers 18 and 20 is less than the combined volume of loadlock 26, cooling chamber 22, and transfer chamber 14, a single pump 32 may be used to pump down the entire volume of system 10 to vacuum. Otherwise, additional pumps may be required to separately pump down reactors 18 and 20.

After wafer 28 is processed in a well known manner inside processing chamber 18 or 20, transfer mechanism 16 can move wafer 28 into cooling chamber 22. Because newly processed wafers may have temperatures of 200° C. or higher and may melt or damage a typical wafer carrier, cooling chamber 22 is provided for cooling the wafers before placing them back into wafer carrier 24.

Subsequently, wafer 28 is picked-up from cooling chamber 22 and replaced in its original slot in carrier 24 using transfer mechanism 16. When carrier 24 has been refilled with processed wafers, carrier 24 is lowered from loadlock 26 and rotated out of position (see arrow 34 which shows one direction of rotation) to allow another platform to move a next wafer carrier into loadlock 26.

Figure 3:
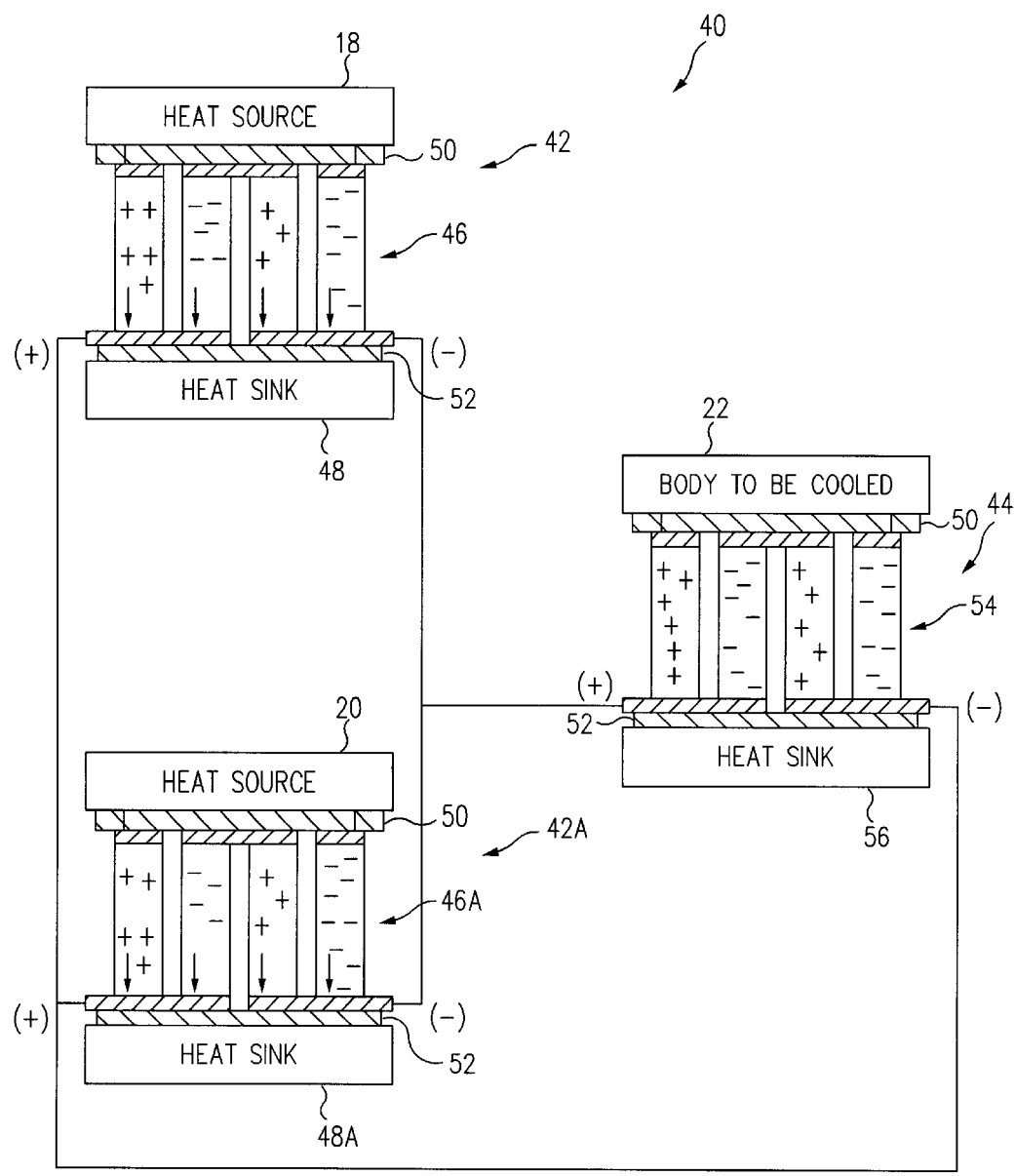
FIG. 3 is a simplified diagram of the heat management system of the present invention.

Referring now to FIGS. 2 and 3, heat management system 40 of the present invention will now be described. Heat management system 40 includes at least one heat source thermally coupled to at least one first thermoelectric module 42. System 40 also includes a body to be cooled coupled to at least one second thermoelectric module 44. Optionally, as described below, additional heat sources and additional bodies to be cooled may each be thermally coupled to additional thermoelectric modules and remain within the scope of the present invention.

In the present invention, the heat source for the thermoelectric generation may be any heat source, including any generated, excess, wasted, and/or recyclable heat source, which is typically found in a semiconductor manufacturing plant. In the embodiment shown in FIG. 3, the heat source may include at least one processing chamber. Preferably, the heat source can be two or more processing chambers, such as processing chambers 18 and 20, previously described with reference to FIG. 2. In the preferred embodiment, processing chambers 18 and 20 are heat sources which can be made to intimately contact thermoelectric modules 42 and 42A, respectively. Alternatively, thermoelectric modules 42 and 42A are disposed remotely from processing chambers 18 and 20 and receive heat from a different source.

In the embodiment illustrated in FIG. 3, first thermoelectric modules 42 and 42A are thermoelectric generators, which produce power, specifically a DC current, through the direct conversion of heat into electricity (Seebeck Effect). In an exemplary embodiment, first thermoelectric module 42 includes energy conversion materials 46 and a heat sink 48. Additional thermoelectric module 42A also includes energy conversion materials 46A and a heat sink 48A. Using the principles of the Seebeck effect, a steady power level may be maintained by maintaining a temperature difference across the hot junction and the cold junction of energy conversion materials 46 and 46A.

Figure 1:
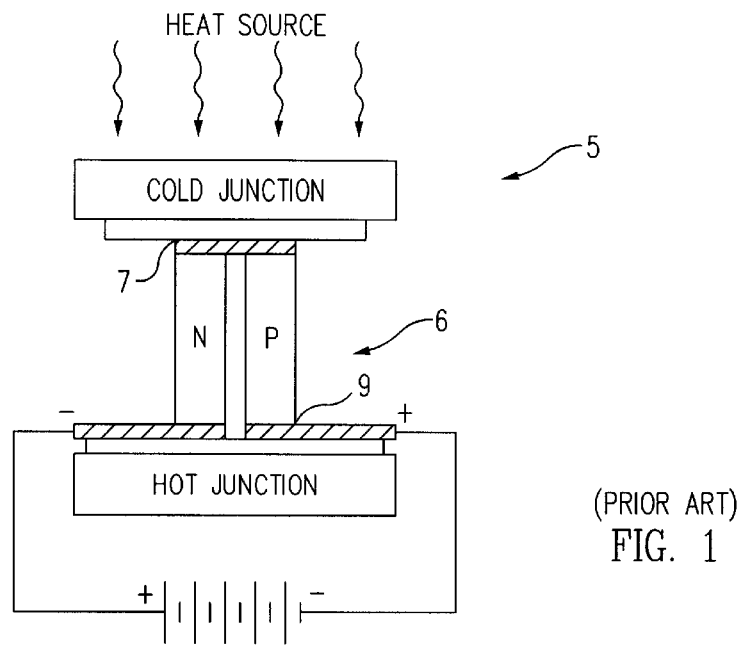
FIG. 1 is a simplified illustration of a typical thermoelectric couple device.

Energy conversion materials 46 and 46A are primarily composed of a number of p- and n-type pairs or couples (FIG. 1). The couples are connected electrically in series and may be sandwiched between electrical insulator/thermal conductor plates 50 and 52. The energy conversion materials are selected to have a high figure of merit, $Z$ (°C.$^{-1}$), defined as:

$$Z=S^2/\rho K,$$

where S=Seebeck coefficient (V/°C.); $\rho$=electrical resistivity, ($\Omega$·cm); K=thermal conductivity, (W/°C·cm). Typical Z values for the most commonly used energy conversion materials are in the range of between about $0.5 \times 10^{-3}$ °C$^{-1}$ and $3 \times 10^{-3}$ °C.$^{-1}$. In some materials, the voltage drop, which occurs between the hot and cold junctions, results from the flow of negatively charged electrons (n-type, hot junction positive). In other materials, the voltage drop which occurs between the hot and cold junctions results from the flow of positively charged voids vacated by electrons (p-type, cold junction positive). In most cases, it is advantageous to use both n-type and p-type materials, so that the thermojunctions can be connected in series electrically and in parallel thermally. Most thermoelectric devices used for generating electricity (or for cooling) use energy conversion materials which are compounds and alloys of lead, selenium, tellerium, antimony, bismuth, germanium, tin, manganese, cobalt, and silicon. For example, one compound may be PbSnTe or Bismuth Telluride. To improve properties of these materials, minute quantities of "dopants" may be added, such as boron, phosphorus, sodium, and iodine. The dopants create an excess of electrons (n-type) or a deficiency of electrons (p-type).

Referring again to the embodiment illustrated in FIG. 3, plate 50 of thermoelectric modules 42 and 42A contacts an external surface of process chambers 18 and 20, respectively. Plate 50 can provide electrical insulation between the process chambers and the energy conversion materials but is a good heat conductor. Plate 50 will typically be made of a ceramic material. The external surface of process chambers 18 and 20 may range in temperatures up to about 250° C.

Heat sinks 48 and 48A are thermally coupled to conversion materials 46 and 46A, through ceramic plate 52. The operation of heat sinks is well known. Heat sinks 48 and 48A represent the cool side of thermoelectric modules 42 and 42A. The cool side must have a temperature less than the temperature of the hot side. In one embodiment, the difference in temperature Dt is between about 5° C. and 100° C.; preferably the difference in temperature Dt ranges from between 5° C. and 50° C. Heat sinks 48 and 48A may include any typical heat sink material, such as brass or stainless steel; preferably aluminum. The configuration of heat sinks 48 and 48A may be any conventional configuration, such as fin beat sink, liquid heat exchanger, cold plates, and the like.

In the present invention, as beat is made to move between the hot junction (heat source) and the cold junction (heat sink), a DC voltage is generated. In one embodiment, conversion materials 46 and 46A can each generate a direct current voltage between about 1 volt and 150 volts and are also capable of generating a current of between about 0.1 amp and about 100 amps. If necessary, more than one thermoelectric module may be coupled together in series to generate larger voltages per unit.

Referring again to FIG. 3, second thermoelectric module 44 includes components similar in form and function to thermoelectric modules 42 and 42A described above. Thus, it should be understood that energy conversion materials 54 and heat sink 56 are similar in form, function, and operation to the energy conversion materials and heat sinks described above.

In this embodiment, module 44 is electrically coupled to thermoelectric modules 42 and 42A, such that the power produced in modules 42 and 42A can be used by module 44. Inputting the power into module 44, causes module 44 to act as a thermoelectric cooler. Thermoelectric cooling uses the Peltier effect, where upon an electric current is imposed across two junctions of a closed circuit of two dissimilar materials to cause heat to be moved or pumped from one junction to the other junction.

As above, energy conversion materials 56 are primarily composed of a number of p- and n-type pairs or couples (FIG. 1). The couples are connected electrically in series and may be sandwiched between electrical Plates 50 and 52 which are electrical insulators and thermal conductors. Plate 50 of thermoelectric module 44 is made to intimately contact an external surface of a body to be cooled. In this embodiment, the body to be cooled includes cooling chamber 22, previously described. The contents of cooling chamber 22, which are the processed wafers; may be in excess of 200° C. The temperature of the wafers should be lowered in temperature to less than about 100° C., so that the wafers can be returned to their carrier.

In the manner described above, heat sink 56 is also thermally coupled to conversion materials 54, through plate 52. Heat is moved or pumped from cooling chamber 22, across conversion materials 54, to heat sink 56. In operation at the cold junction, energy (heat) is absorbed from Chamber 22 by electrons as they pass from a low energy level in the p-type elements to a higher energy level in the n-type elements. Power from first thermoelectric modules 42 and 42A provide the energy to move electrons through each module at the hot junction, energy is expelled to heat sink 56 as in the n-type elements, electrons move from a higher energy level to a lower energy level in the p-type elements. In one embodiment, a difference in temperature DT between the hot side and the cool side may be between about 5° C. and 100° C.; preferably, the difference in temperature Dt ranges from between 5° C. and 50° C. Heat sink 56 may include any suitable heat sink material, such as brass, stainless steel; preferably aluminum. The configuration of heat sink 56 may be any conventional configuration, such as fin heat sink, liquid heat exchanger, cold plates, and the like.

As described above, the power produced in conversion materials 46 and 46A is delivered to conversion materials 54, such that heat is pumped between the hot junction (cooling chamber 22) and the cold junction (heat sink 56) In one embodiment, conversion materials 54 may use a direct current voltage between about 1 and 150 volts. If necessary, more than one module 44 may be coupled together in series, for example with module 44A (FIG. 2), to remove more heat from cooling chamber 22.

In an alternative embodiment, each thermoelectric device may be independently driven from an external power source.

Figure 4:
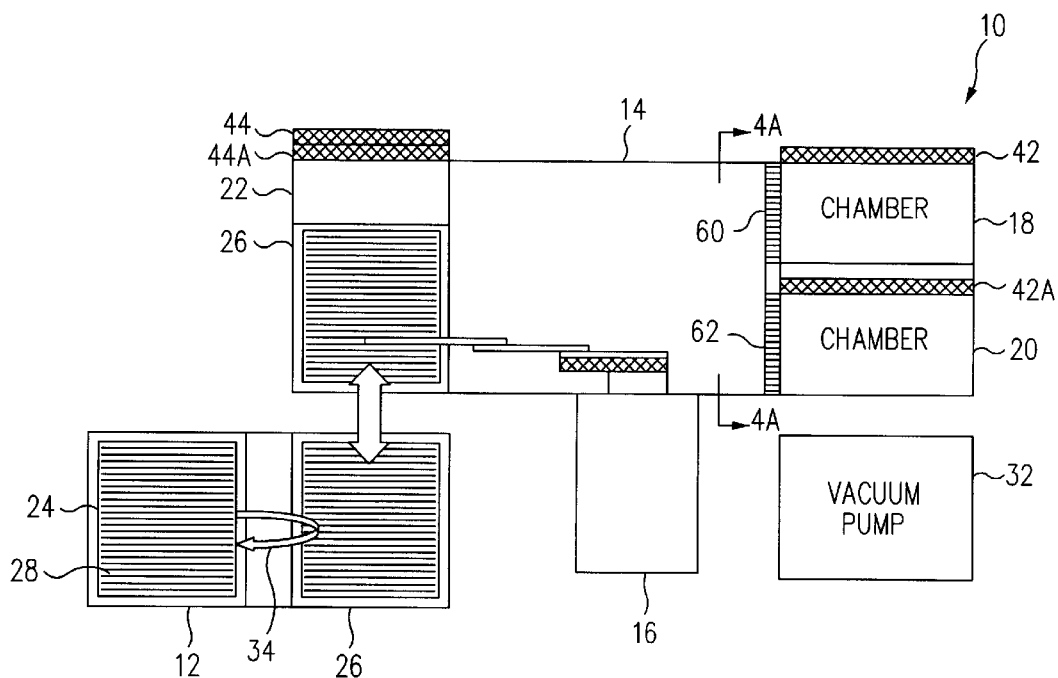
FIGS. 4 and 4A are simplified illustrations of an alternative embodiment of the present invention.
Figure 4A:
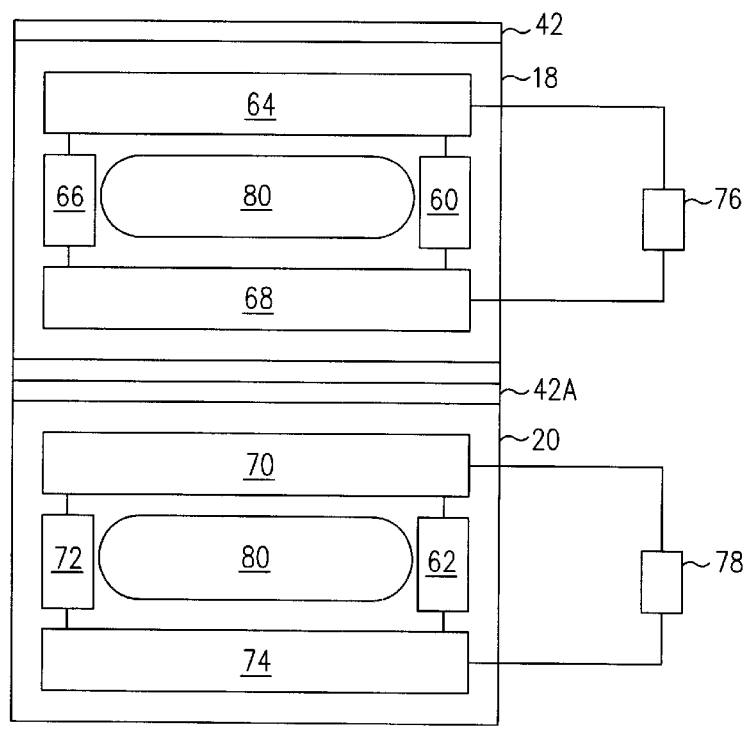

FIGS. 4 and 4A are simplified illustrations of an alternative embodiment of the present invention. As best understood with reference to FIG. 4, process chambers 18 and 20 may each have at least one thermoelectric device 60 and 62 disposed between chambers 18 and 20 and transfer chamber 14. In this embodiment, transfer chamber 14 provides a relatively large heat sink for thermoelectric devices 60 and 62 to operate. Optionally, as shown in FIG. 4A, a plurality of thermoelectric devices 60, 62, 64, 66, 68, 70, 72, and 74 may be disposed between transfer chamber 14 and process chambers 18 and 20. The thermoelectric devices can be placed around access port 80, such that the devices are in intimate contact with the mating portions of chambers 18 and 20 and transfer chamber 14. The current generated in the plurality of thermoelectric devices may be used to power any electrical appliance, such as lights, computers, controllers, robots, data storage devices, and other similar appliances. Optionally, the current may be supplied to batteries 76 and 78 for storage. The stored electricity may be used as needed as an uninterrupted power supply (UPS), which may be needed should a power outage to the system occur. Preferably, the UPS can provide up to between about 12 and 24 volts for at least 2 to 3 minutes of operation.

Many thermoelectric generators and coolers, such as those described above, which are capable of being used in heat management system 40, are available commercially from various manufacturers and distributors, such as Global Thermoelectric, of Humble, Texas and MELCOR, of Trenton, N.J. In most cases, these generators/coolers can be tailored to provide the desired voltage outputs for a selected range of temperature difference over the thermoelectric materials. In one example, with no intent to limit the invention thereby, a thermoelectric generator design solution was prepared by MELCOR, for a heat management system in accordance with the present invention having a hot side temperature of about 200 C, a cool side temperature of about 25 C, a voltage requirement of about 12 volts, and a current requirement of about 1 amp. The solution includes using three MELCOR Model HT6-12-40 thermoelectric generators, in series. The three generators are capable of producing a total voltage of about 13 volts, a total current of about 1.4 amps, and a total power of about 19 watts.

The description of the invention given above is provided for purposes of illustration and is not intended to be limiting. The invention is set forth in the following claims.

What is claimed is:

1. A semiconductor wafer processing system comprising:

a first processing chamber for conducting a process on a semiconductor substrate, said first processing chamber including a first thermoelectric module operative for generating a current; and a second processing chamber for conducting a process on a semiconductor substrate, said second processing chamber including a second thermoelectric module which receives said current and is operative for changing a temperature of said second process chamber.

2. The wafer processing system of claim 1, wherein said current is a DC current.

3. The wafer processing system of claim 1, wherein said first thermoelectric module is a thermoelectric generator comprising energy conversion materials and a heat sink.

4. The wafer processing system of claim 3, wherein said energy conversion materials include alloys and compounds of materials taken from the group consisting of lead, selenium, tellerium, antimony, bismuth, germanium, tin, manganese, cobalt, and silicon.

5. The wafer processing system of claim 4, wherein said conversion materials are doped with minute quantities of dopants taken from the group consisting of boron, phosphorus, sodium, and iodine.

6. The wafer processing system of claim 1, wherein said second thermoelectric module is a thermoelectric cooler comprising energy conversion materials and a heat sink.

7. The wafer processing system of claim 1, wherein said current ranges between 0.1 amp and 100 amps.

8. The wafer processing system of claim 1, wherein said first process chamber comprises a thermal reactor and said second process chamber comprises a cooling chamber.

9. A semiconductor wafer processing system comprising:

a first processing chamber including a first thermoelectric module operative for generating a current;

a second processing chamber including a second thermoelectric module which receives said current and is operative for changing a temperature of said second process chamber; and a third processing chamber including a third thermoelectric module operative for generating a current.

10. A semiconductor wafer processing system comprising:

a first wafer processing chamber including a first thermoelectric module operative for heating said first wafer processing chamber in response to receiving a first current; and a second wafer processing chamber including a second thermoelectric module operative for cooling said second wafer processing chamber in response to receiving a second current.

11. A semiconductor wafer processing system comprising:

a first wafer processing chamber providing a first source of thermal energy;

a first thermoelectric module being operative for generating a first current in response to receiving said thermal energy;

a second wafer processing chamber having a first temperature; and a second thermoelectric module being configured to receive said first current and being operative for changing said first temperature to a second temperature.

12. A semiconductor wafer processing system comprising:

a first processing chamber providing a source of thermal energy;

a first thermoelectric module being operative for generating a first current in response to receiving said thermal energy;

a second processing chamber having a first temperature;

a second thermoelectric module being configured to receive said first current and being operative for changing said first temperature to a second temperature;

a third chamber providing a second source of thermal energy; and a third thermoelectric module being operative for generating a second current in response to receiving said thermal energy.

13. A method for processing a semiconductor wafer comprising:

generating a current with a first thermoelectric module using a heat source; and removing heat from a wafer processing chamber using a second thermoelectric module which is made operative by said current.

14. The method of claim 13, wherein said heat source comprises a thermal reactor.

15. The method of claim 13, wherein said first thermoelectric module is a thermoelectric generator.

16. The method of claim 13, wherein said second thermoelectric module is a thermoelectric cooler.

17. The method of claim 13, wherein said current ranges between 0.1 and 100 amps.

18. A semiconductor wafer processing system comprising:

at least one thermal processing chamber providing a heat source;

a heat sink; and at least one thermoelectric module operative for generating a current when intimately contacting said thermal processing chamber and said heat sink, said heat sink including a wafer transfer chamber and said thermal processing chamber including a rapid thermal processor.

19. The system of claim 18, wherein said current provides an uninterrupted power supply.

* * * * *